United States Patent
Priel et al.

(10) Patent No.: US 9,842,066 B2
(45) Date of Patent: Dec. 12, 2017

(54) INTEGRATED CIRCUIT COMPRISING AN IO BUFFER DRIVER AND METHOD THEREFOR

(75) Inventors: Michael Priel, Netanya (IL); Dan Kuzmin, Givat Shmuel (IL); Sergey Sofer, Rishon Lezion (IL)

(73) Assignee: NXP USA, Inc., Austin, TX (US)

( * ) Notice: Subject to any disclaimer, the term of this patent is extended or adjusted under 35 U.S.C. 154(b) by 505 days.

(21) Appl. No.: 14/398,876

(22) PCT Filed: May 31, 2012

(86) PCT No.: PCT/IB2012/052733
§ 371 (c)(1),
(2), (4) Date: Nov. 4, 2014

(87) PCT Pub. No.: WO2013/179093
PCT Pub. Date: Dec. 5, 2013

(65) Prior Publication Data
US 2015/0095525 A1    Apr. 2, 2015

(51) Int. Cl.
*G06F 13/10* (2006.01)
*G11C 7/04* (2006.01)
*G11C 7/10* (2006.01)
*G06F 1/14* (2006.01)

(52) U.S. Cl.
CPC ........... *G06F 13/10* (2013.01); *G06F 1/14* (2013.01); *G11C 7/04* (2013.01); *G11C 7/106* (2013.01); *G11C 7/1069* (2013.01); *G11C 7/1087* (2013.01); *G11C 7/1096* (2013.01)

(58) Field of Classification Search
USPC .............. 327/108, 112; 326/82–83, 87, 91
See application file for complete search history.

(56) References Cited

U.S. PATENT DOCUMENTS

| | | | | |
|---|---|---|---|---|
| 5,387,824 A | * | 2/1995 | Michelsen | G11C 7/1051 326/21 |
| 5,977,790 A | * | 11/1999 | Sanwo | H03K 19/00361 326/27 |
| 6,051,995 A | | 4/2000 | Pollachek | |
| 6,242,942 B1 | * | 6/2001 | Shamarao | H03K 17/164 326/27 |
| 6,448,807 B1 | * | 9/2002 | Ahsanullah | H03K 17/164 326/26 |
| 6,924,669 B2 | | 8/2005 | Itoh et al. | |
| 7,009,905 B2 | | 3/2006 | Aipperspach et al. | |
| 2005/0242840 A1 | | 11/2005 | Ngo et al. | |
| 2007/0057703 A1 | | 3/2007 | Kumar et al. | |
| 2014/0002160 A1 | | 1/2014 | Priel et al. | |

OTHER PUBLICATIONS

International Search Report and Written Opinion correlating to PCT/IB2012/052733 dated Feb. 21, 2013.

* cited by examiner

*Primary Examiner* — An Luu (57) ABSTRACT

An integrated circuit for bias stress condition removal comprising at least one input/output (IO) buffer driver circuit comprising at least one input signal is described. A primary buffer driver stage receives the at least one input signal and providing an output signal in a first time period; and a secondary buffer driver stage receives the at least one input signal and providing an output signal in a second time period. The primary buffer driver stage and the secondary buffer driver stage cooperate and an operational mode of the primary buffer driver stage and an operational mode of the secondary buffer driver stage is varied to produce a varying output signal.

14 Claims, 5 Drawing Sheets

INTEGRATED CIRCUIT COMPRISING AN IO BUFFER DRIVER AND METHOD THEREFOR

FIELD OF THE INVENTION

The field of this invention relates to an integrated circuit comprising at least one input/output (IO) buffer/driver and method therefore.

BACKGROUND OF THE INVENTION

There remains a general trend in integrated circuit (IC) designs for the size of the IC to be scaled down. In particular, in the field of input/output (IO) buffers and/or drivers and integrated circuits therefore, there has been a trend to use ever-smaller transistors.

However, in some applications, such as, but not limited to, the automotive market, it is known that ICs still often require high voltage interfaces, thereby dictating the use of larger transistors. Furthermore, the use of ever-smaller transistors leads to higher transistor stresses, and in particular an increase in bias temperature instability (BTI) stress. Over time, this increase in BTI results in transistor performance degradation.

The maximum BTI stress effect occurs when the transistors are in active use, for example when an inverter is arranged to constantly drive a logic "1" level, thus being under continuous stress. Thus, a typical approach to reduce BTI stress is to introduce transistor toggling or switching, even at a very low toggling frequency, due to the 'recovery effect' at the moment the stress is removed. The amount the IC device recovers depends on the length of time the stress occurs: inasmuch as the longer the stress, the less the recovery. U.S. Pat. No. 7,009,905 B2 proposes a mechanism to reduce BTI effects using different modes of a memory operating to change stressed transistors.

Figure 1:
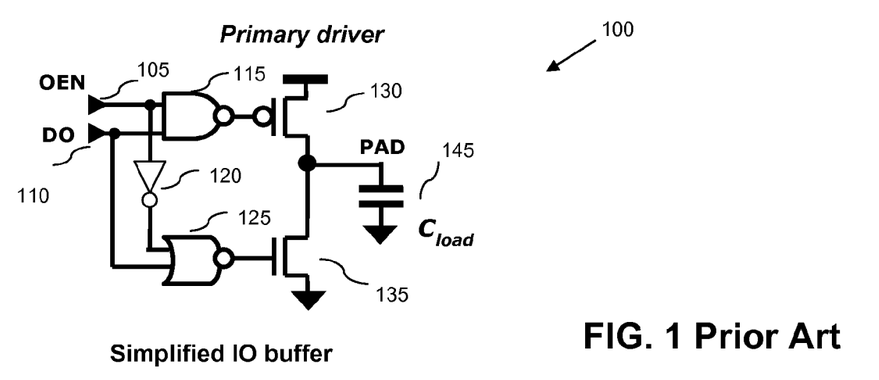
FIG. 1 illustrates a known circuit diagram of an IO buffer/driver.

FIG. 1 illustrates a known circuit diagram 100 of an IO buffer/driver that utilises toggling/switching transistors 130, 135. Two inputs 105, 110 are input to a buffer part comprising respective NAND logic gate 115 and NOR logic gate 125. The NOR logic gate 125 receives one input 105 that is inverted 120. The IO buffer/driver 100 utilises a primary driver part that comprises toggling/switching transistors 130, 135 to provide an output to a capacitive (or active) load 145. The primary driver part comprises a first transistor 130 that receives an inverted output from the NAND logic gate 115 and a second transistor 135 that receives an output from the NOR logic gate 125. The primary driver transistors 130, 135 may be toggled/switched with a change in the IO driver state, for example by control of one of the input signals, e.g. input 110, thereby reducing their active use time.

However, no interface protocols are known that allow voluntary toggling on IO pads, since this often leads to faults in communication. Notwithstanding this, it is known that some interface protocols allow toggling on the specific signals during "IDLE" mode, whilst maintaining some of the signals passing there through at their defined value.

SUMMARY OF THE INVENTION

The present invention provides an input/output (IO) buffers and/or drivers and integrated circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Because the illustrated embodiments of the present invention may, for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

In example embodiments, an IO driver circuit is configured in such way that allows the primary driver transistor that is placed under stress to be toggled/switched, with no changing IO driver state. In example embodiments, the IO driver circuit is configured such that the primary driver transistor comprises an additional, alternative IO driver circuit. In some examples, the additional, alternative IO driver circuit is placed in parallel to the primary driver.

Figure 2:
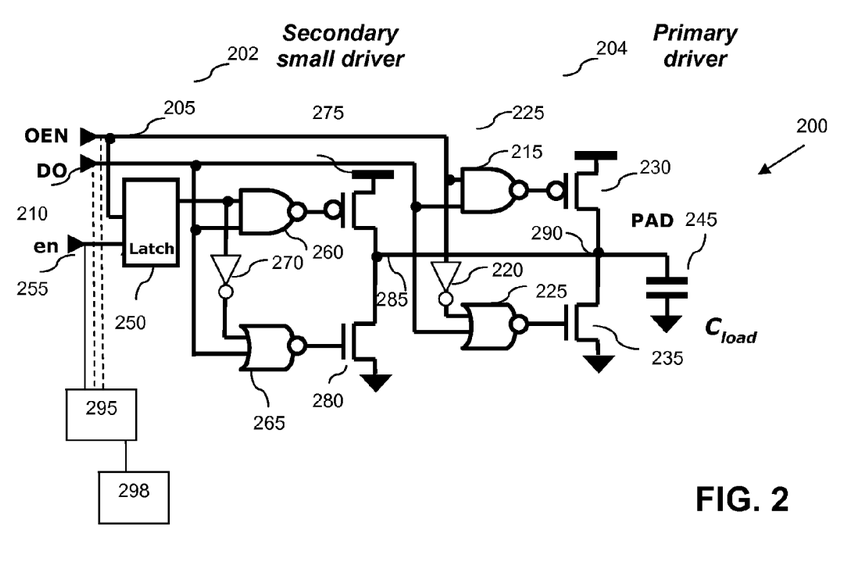
FIG. 2 illustrates a simplified example of a circuit diagram of an IO buffer/driver.

FIG. 2 illustrates an example of a circuit diagram 200 of an IO buffer/driver arrangement that utilises toggling/switching transistors 230, 235. The exemplary IO buffer/driver circuit comprises a secondary small buffer/driver stage 202 and a primary buffer/driver stage 204. Two inputs 205, 210 are input to the IO buffer/driver. The signals applied to the input ports 205, 210 represent classical IO buffer signals: for example DATA OUT (DO) 210 representing the logic signal to be transferred outside the chip/Integrated circuit (IC); and OUTPUT ENABLE (OEN) 205 representing the control that allows the transfer of the DATA OUT signal outside the chip/IC or set the output to a high impedance state. In other examples, other logic signals or controls may be added for additional IO buffer functionality, but the described signals represent the preferred minimal set of any IO buffer. A first data input 205 is input to a latch element 250, which comprises at least one further (second) input for receiving an enable signal 255 in order to latch the input signal to an output port of the latch element 250. In other examples, the latch element may be replaced by any controllable time delay element or circuit, such as flip-flops, memory elements, delay lines, etc. The purpose of the latch element is to allow generation of a control signal to the secondary driver, derived from the state of the signals DO and OEN combined with the enable (EN) signal 255. The output from the latch element 250 is input to a second buffer part of secondary buffer/driver stage 202, wherein the second buffer part comprises a respective second NAND logic gate 270 and second NOR logic gate 265. The second NAND logic gate 270 receives, as its two inputs, the output from the latch 250 and the second input signal 210. The second NOR logic gate 265 receives, as its two inputs, an inverted 270 output from the latch 250 and the second input signal 210. The output from the second NAND logic gate 270 is coupled to a first transistor 275 in a secondary small driver stage. The output from the second NOR logic gate 265 is coupled to a second transistor 280 in the secondary small driver stage.

Thus, in the circuit of FIG. 2, the primary and secondary drivers operate in an alternate manner, for example when the primary driver is 'ON', the secondary driver is 'OFF', and when refreshing, the primary driver is 'OFF' whilst the secondary driver is 'ON'.

In other examples, the at least one first buffer part and/or the at least one second buffer part may be replaced by any other buffer device, element or circuit, such as buffer devices of different driving strength, as will be explained below.

The switched output from the secondary small driver stage is operably coupled to the primary driver output stage 204 at 290.

The primary driver stage 204 comprises a first buffer part and a first driver part. The first buffer part comprises respective first NAND logic gate 215 and first NOR logic gate 225, coupled to a primary driver part. The first NOR logic gate 225 receives one input 205 that is inverted 220 and a second input receiving the data input 210. The primary driver part comprises a first transistor 230 that receives an inverted output from the NAND logic gate 215 and a second transistor 235 that receives an output from the NOR logic gate 225. The IO buffer/driver 200 utilises a primary driver part that comprises toggling/switching transistors 230, 235 to provide an output to a load 245.

In the known manner, the primary driver transistors 230, 235 may be toggled/switched with a change in the IO driver state, for example by control of one of the input signals, e.g. input 210, thereby reducing their active use time. However, in accordance with example embodiments, the exemplary circuit of FIG. 2 employs a secondary small driver stage 202 to provide an output via point 290 to the load 245 when the primary driver is 'off'. In this manner, the primary driver stage 204 can now be toggled, as the secondary small driver stage 202 may be configured to provide an output statically (e.g. keep the correct logic state) when the primary driver stage is switched 'off' and therefore not used. Hence, the secondary small driver stage 202 is not in use as the IO driver in normal operation, but is operational/serves only for supporting the 'refresh' states.

In some examples, the additional, alternative IO driver circuit may be configured to keep driving the previous value generated by the primary driver stage, whilst the primary driver transistor is switched 'off' for a short period of time and mainly in a static situation when there is no need to charge or discharge the load capacitance or provide a controlled impedance. In this manner, the total size of driver circuit/integrated circuit may not be significantly changed In some examples, the additional, alternative IO driver circuit, which in the example of FIG. 2 is the secondary small driver stage 202, may comprise a smaller transistor arrangement than the primary driver. In a static situation, the relationship between the smaller transistor arrangement of the secondary small driver stage 202 and the primary driver stage may be implemented, for example, as say a 50 Ohm (active) resistance divided by, say, a 1-5 kOhm resistor for pull-up or pull-down purposes. In a dynamic situation the smaller transistor arrangement of the secondary small driver stage 202 may be of the same order of magnitude as the primary driver stage. In this example, the additional, alternative IO driver circuit may be configured to keep driving the previous value generated by the primary driver stage, whilst the primary driver transistor is switched 'off' for a short period of time. In this manner, the total size of driver circuit/integrated circuit may not be significantly changed.

In some examples, a first time period when the primary buffer/driver is operating in an 'on' state may be different to a second time period when the secondary buffer/driver is operating in an 'on' state. In some examples, the first time period may be configured to substantially not overlap the second time period, in order to achieve maximum power efficiency.

In some example applications, the small additional, alternative IO driver toggling operation may be activated in conjunction with applications where real toggling of the primary driver stage is used to reduce stress, although in general the secondary driver BTI performance degradation is of little concern.

In some examples, the secondary (small) driver may be switched 'off' when in a steady state condition, for example when the primary driver is switched 'on', in order to avoid any BTI effect on the additional, alternative (secondary) IO small driver stage.

In these examples, the IO driver is not the inverter in known IO buffer/driver circuits, but is instead the 'tri-state inverter', for example the device that is able to enter a hi-impedance state when disabled. This is because the same signal cannot be driven with two different voltage levels. Thus, the primary driver may be disabled whilst the IO buffer/driver circuit is operational, thereby creating a 'refreshing' toggle operation. Simultaneously, the IO signal is connecting to the secondary driver stage (either operating as a small transistor keeper as illustrated in FIG. 3 or as a current source in FIG. 4) and then reverting back to its previous state.

Figure 3:
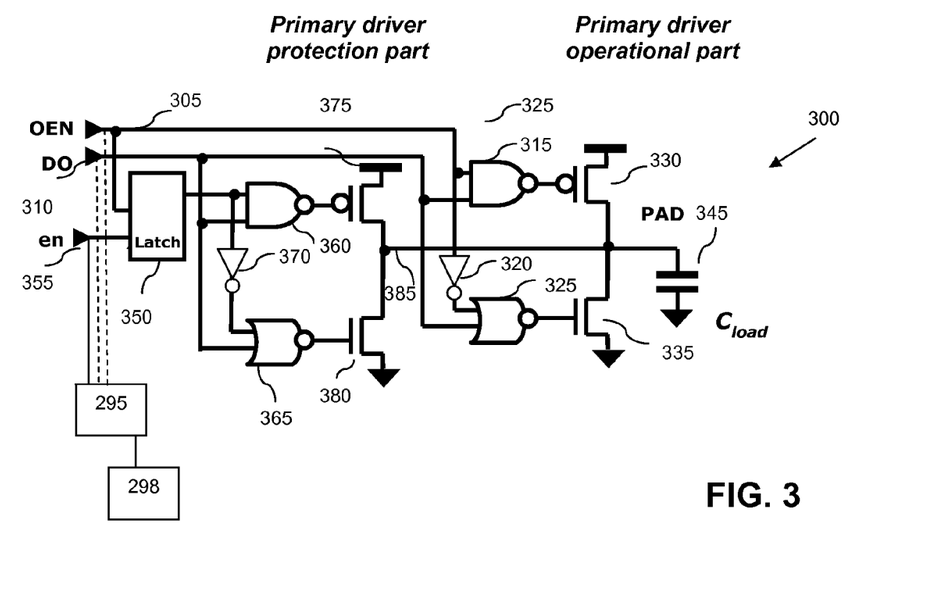
FIG. 3 illustrates a further simplified example of a circuit diagram of an IO buffer/driver.

FIG. 3 illustrates a further example of a circuit diagram 300 of an IO buffer/driver that utilises toggling/switching transistors 330, 335. Unlike the example of FIG. 2, the IO buffer/driver of FIG. 3 is configured to be operational for both normal IO operation and as a provision of protection parts used to drive the output signal. The circuit diagram 300 represents a situation where the secondary driver used as BTI protection, serves as a part of the 'functional' primary driver in normal operating mode. In this example, the output is provided by both a first transistor driver 375 and a first NOR logic gate 325 when they are operational, whereas during the refreshing stage only the first transistor driver 375 is operational, while the stress is removed from the first NOR logic gate 325. Thus only the small part (the first transistor driver) 375 suffers from the BTI-driven degradation. This is good trade-off between the silicon area impact (a characteristic for the circuit diagram of FIG. 2) and the BTI-driven degradation's amount.

The exemplary IO buffer/driver circuit comprises a secondary buffer/driver stage 302 and a primary buffer/driver stage 304. Two inputs 305, 310 are input to the IO buffer/driver. A first data input 305 is input to a latch element 350, which comprises a further input for receiving an enable signal 355 to latch the input signal to an output port of the latch 350. The output from the latch 350 is input to a second buffer part of secondary buffer/driver stage 302, wherein the second buffer part comprises a respective second NAND logic gate 370 and second NOR logic gate 365. The second NAND logic gate 370 receives, as its two inputs, the output from the latch 350 and the second input signal 310. The second NOR logic gate 365 receives, as its two inputs, an inverted 370 output from the latch 350 and the second input signal 310. The output from the second NAND logic gate 370 is coupled to a first transistor 375 in a secondary driver stage. The output from the second NOR logic gate 365 is coupled to a second transistor 380 in the secondary driver stage.

The switched output from the secondary driver stage is operably coupled to the primary driver stage 304 at 390.

The primary driver stage 304 comprises a first buffer part and a first driver part. The first buffer part comprises respective first NAND logic gate 315 and first NOR logic gate 325, coupled to a primary driver part. The first NOR logic gate 325 receives one input 305 that is inverted 320 and a second input receiving the data input 310. The primary driver part comprises a first transistor 330 that receives an inverted output from the NAND logic gate 315 and a second transistor 335 that receives an output from the NOR logic gate 325. The IO buffer/driver 300 utilises a primary driver part that comprises toggling/switching transistors 330, 335 to provide an output to a capacitive load 345.

In the known manner, the primary driver transistors 330, 335 may be toggled/switched with a change in the IO driver state, for example by control of one of the input signals, e.g. input 310, thereby reducing their active use time. However, in accordance with example embodiments, the exemplary circuit of FIG. 3 employs a secondary driver stage 302 to supplement the primary driver level during normal operation and provide an output via point 390 to the capacitive load 345. In the example of FIG. 3, for a 'refresh' operation the operational part of the signal (enable) is switched twice to create a transition, while the protection part's enable, is kept at the desired logic level by the latch. In this manner, the correct logic value is ensured as the signal is driven through the IO buffer.

Figure 4:
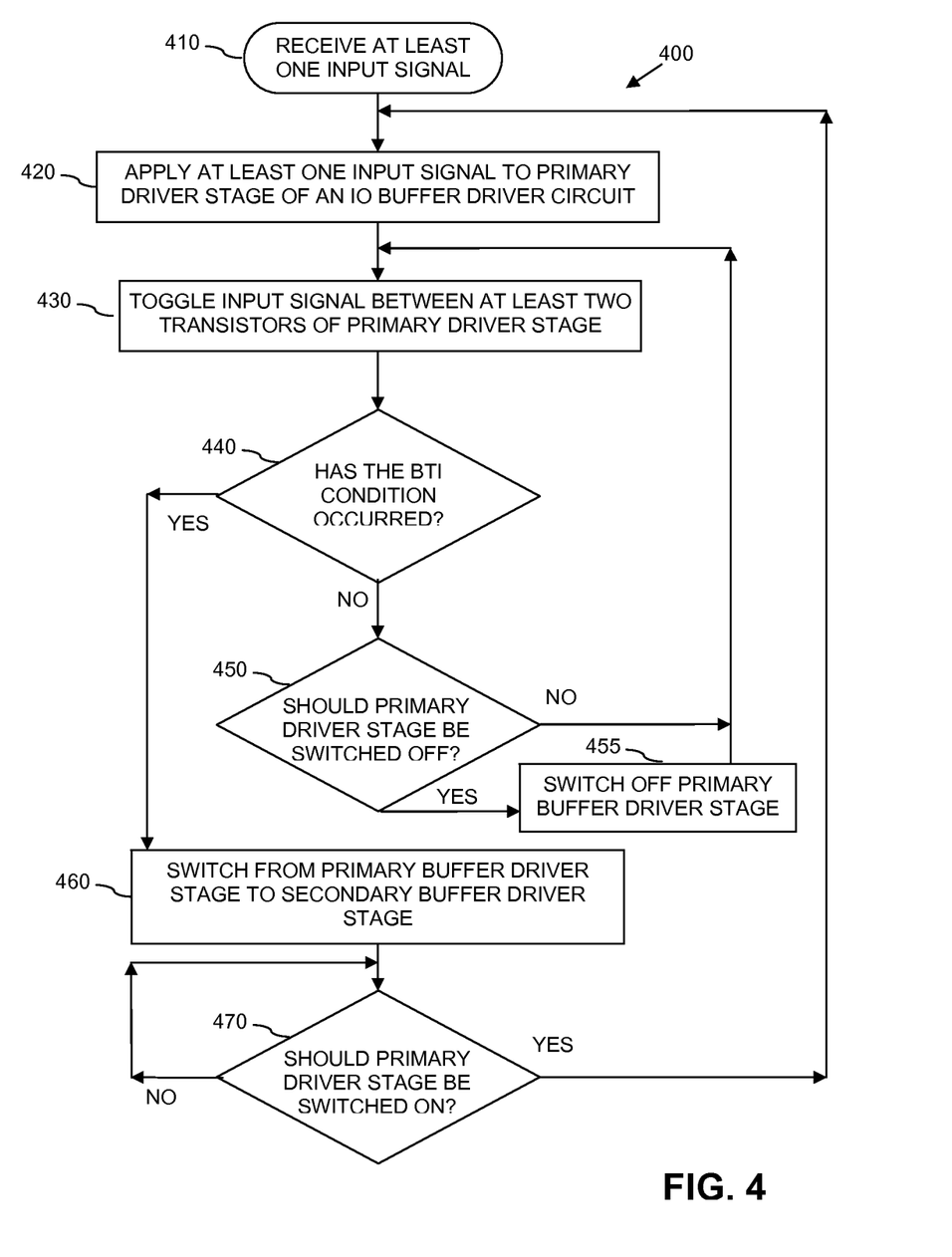
FIG. 4 illustrates a simplified example flowchart of a method of switching between buffer/driver stages in an IO buffer/driver circuit.

FIG. 4 illustrates a simplified example flowchart 400 of a method of switching between buffer/driver stages in an IO buffer/driver circuit. The flowchart 400 commences with a receipt of at least one input signal at an IO buffer driver circuit in 410. In 420, the at least one input signal is applied to a primary driver stage of the IO buffer driver circuit. In 430, the output of the IO buffer driver circuit is arranged to toggle between at least two transistors of the primary driver stage. In 440, a determination is made as to whether a BTI condition has occurred. If a BTI condition has not occurred in 440, a determination is made as to whether the primary driver stage should be switched off, say temporarily, in 450. If it is determined that the primary driver stage should not be switched off, in 450, the flowchart loops to 430, and the toggling operation within the primary driver stage continues. Alternatively, following the determination in 450, the primary buffer driver stage may be switched off, as shown in 455 and the process loops back to 430. However, if a BTI condition has occurred in 440, the output of the IO buffer/driver circuit is switched from the primary buffer driver stage to a secondary buffer driver stage, in 460. In 470, a determination is made as to whether the primary buffer driver stage should be switched back in. If it is determined, in 470, that the primary buffer driver stage should not be switched back in, in 470, the flowchart loops. However, if it is determined, in 470, that the primary buffer driver stage should be switched back in, the flowchart loops back to 410 and the input signals are applied to the primary buffer driver stage and the output obtained therefrom.

Thus, examples of the invention also provide for a method for bias stress condition removal in a circuit comprising at least one input/output (IO) buffer driver circuit. The method comprises receiving at least one input signal at a primary buffer driver stage and providing an output signal in a first time period; receiving the at least one input signal at a secondary buffer driver stage and providing an output signal in a second time period, wherein the primary buffer driver stage and the secondary buffer driver stage cooperate; and varying an operational mode of the primary buffer driver stage and varying an operational mode of the secondary buffer driver stage to produce a variable output signal.

Figure 5:
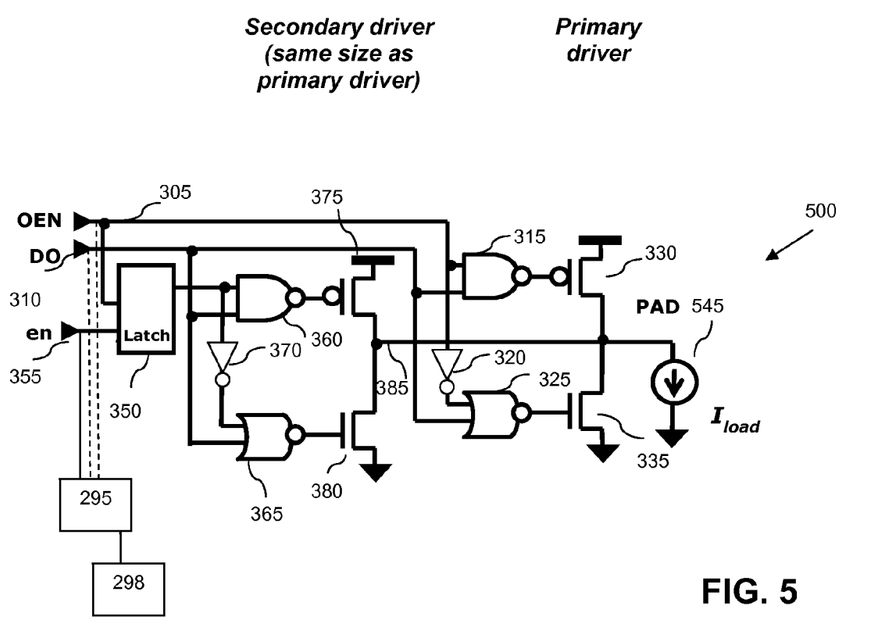
FIG. 5 illustrates a yet further simplified example of a circuit diagram of an IO buffer/driver.

FIG. 5 illustrates a yet further example of a circuit diagram 500 of an IO buffer/driver that utilises toggling/switching transistors 330, 335. Unlike the example IO buffer/driver of FIG. 2 or FIG. 3, FIG. 5 is configured to provide a particular output current level 545. In this manner, the example IO buffer/driver circuit of FIG. 5 may be applied in applications that employ certain protocols (such as DDR3), where there is a requirement to supply specific current through the IO buffer to the load. Regardless of whether a 'refresh' operation may be employed, the (in some examples 'small') secondary driver stage may not be able to provide the required current, and in this instance an output current source may be employed. In this instance, the transistors of the secondary driver stage may therefore be of the same size as the transistors of the primary driver stage.

Although the simplified examples of FIGS. 2-5 are illustrated using a single secondary stage and a single primary stage, in other examples, a plurality of stages may be employed. Similarly, although the simplified examples of FIGS. 2-5 are illustrated using a pair of secondary transistors and a pair of primary transistors, in other examples, a variety of transistor circuits and architectures may be employed.

In some examples, as illustrated in each of FIGS. 2-5, the IO buffer/driver circuit may include a processor module 295, which in some examples may be a digital signal processor, operably coupled to a timer 298. In one example, the processor module 295 may be configured to effect the switching of the transistors of the secondary and/or primary driver stages, for example via the enable signal applied to the latch element 250, 350.

In one example, the processor module 295 may be configured to monitor the input signals, and in response thereto the processor module 295 may control the switching of the transistors of the secondary and/or primary driver stages, for example via the enable signal applied to the latch element 250, 350. In some examples, the processor module 295 may be configured to apply an 'automatic' switching operation only in scenarios where normal functionality switching is identified as not happening, say for a pre-defined time. In this regard, the timing of the enable signal may be obtained from timer 298. In alternative examples, the processor module 295 may be configured to monitor and identify when BTI condition occurs, and in this situation the processor module 295 may effect switching to happen based on, say, an internal timer (not shown). Since the processor module 295 is a circuit element that initiates the communication outside of the chip/IC through the IO, the processor module 295 has complete information about the timing and the content of this communication. For example, if there is no actively switching data communicated outside of the chip/IC, the processor module 295 may be able to initiate a refresh operation, say, every 'XX' internal clock cycles, where 'XX' cycles may be understood as being an amount of cycle or time period, defined by the process and based on, for example, transistor ageing parameters and/or interface protocol features. In another example, the processor module 295 may identify that the access is performed to specific external memory addresses, thereby causing some address bits to be static, and perform refresh every, say, 'XX' cycles to those bits or to the entire bus. For yet another example, when the processor module 295 cannot monitor the content of transfers, it may initiate a refresh operation regardless of the content every 'XX' cycles.

In some examples, the IO buffer/driver circuit may be configured with an ability to cause switching to ensure that the output remains constant. In this manner, BTI effect impact may be significantly reduced without increasing driver size or impacting functionality.

In some examples, the IO buffer/driver circuit may be configured to provide current for external pull-up/pull-down resistors. In this example, there may be trade-off between the size of the secondary (and in some instances parallel) transistor, and the period of time that the primary driver stage is switched 'off', which in turn may be based on a toggling frequency used. In this example, the processor module 295 is configured to adapt the toggling frequency, and thus the amount of time that the primary driver stage may be turned 'off', dependent upon the application and/or prevailing operating conditions.

Thus, examples of the invention provide an integrated circuit for bias stress condition removal comprising at least one input/output (IO) buffer driver circuit. The input/output (IO) buffer driver circuit comprises: at least one input signal; a primary buffer driver stage for receiving the at least one input signal and providing an output signal in a first time period; and a secondary buffer driver stage for receiving the at least one input signal and providing an output signal in a second time period. The primary buffer driver stage and the secondary buffer driver stage cooperate and an operational mode of the primary buffer driver stage and an operational mode of the secondary buffer driver stage is varied to produce a variable output signal.

In some examples, the first time period may be different to the second time period. In some examples, the first time period may overlap the second time period. In some examples, the integrated circuit may comprise a processor module operably coupled to a timer circuit arranged to ensure that the first time period is different to the second time period. In some examples, the primary buffer driver stage may be connected in parallel to the secondary buffer driver stage. In some examples, the secondary buffer driver stage may be configured to maintain at an output of the IO buffer driver circuit a previous value generated by the primary driver stage.

In some examples, the secondary buffer driver stage may be configured to maintain the previous value generated by the primary driver stage, whilst the primary driver stage is switched off. In some examples, the secondary buffer driver stage may be a size factor smaller than the primary buffer driver stage.

In some examples, a latch element may be operably coupled to the secondary buffer driver stage and arranged to receive the at least one input signal and provide a latched input signal to the secondary buffer driver stage.

In some examples, the secondary buffer driver stage may be switched off when in a steady state condition whilst the primary driver is switched on. In some examples, the secondary buffer driver stage may be part of and cooperate with the primary driver stage.

In some examples, the secondary buffer driver stage may be switched off when in a steady state condition, whilst the primary driver is switched on. In some examples, a processor module may be configured to apply an automatic switching of the IO buffer driver circuit output from the primary buffer driver stage to the secondary buffer driver stage operation. In some examples, a processor module may be configured to monitor and identify when a bias temperature instability (BTI) degradation condition may be met, and in response thereto effect switching of the IO buffer driver circuit output from the primary buffer driver stage to the secondary buffer driver stage operation.

In some examples, a processor module may be configured to adapt a toggling frequency of switching of the IO buffer driver circuit output from the primary buffer driver stage to the secondary buffer driver stage operation, dependent upon an IO buffer driver application and/or at least one prevailing operating condition.

In the foregoing specification, the invention has been described with reference to specific examples of embodiments of the invention. It will, however, be evident that various modifications and changes may be made therein without departing from the broader spirit and scope of the invention as set forth in the appended claims, and that accordingly these are not limited to the examples described.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit for bias stress condition removal comprising at least one input/output (IO) buffer driver circuit comprising:
   at least one input signal;
   a primary buffer driver stage for receiving the at least one input signal and providing an output signal in a first time period; and
   a secondary buffer driver stage for receiving the at least one input signal and providing an output signal in a second time period;
   a processor module configured to monitor and identify when a bias temperature instability (BTI) degradation condition may be met, and in response thereto effect switching of the IO buffer driver circuit output from the primary buffer driver stage to the secondary buffer driver stage operation,
   wherein the primary buffer driver stage and the secondary buffer driver stage cooperate and an operational mode of the primary buffer driver stage and an operational mode of the secondary buffer driver stage is varied to produce a variable output signal.

2. The integrated circuit of claim 1 wherein the first time period is different to the second time period.

3. The integrated circuit of claim 1 wherein the first time period overlaps the second time period.

4. The integrated circuit of claim 1 wherein the processor module is operably coupled to a timer circuit arranged to ensure that the first time period is different to the second time period.

5. The integrated circuit of claim 1 wherein the primary buffer driver stage is connected in parallel to the secondary buffer driver stage.

6. The integrated circuit of claim 1 wherein the secondary buffer driver stage is configured to maintain at an output of the IO buffer driver circuit a previous value generated by the primary driver stage.

7. The integrated circuit of claim 6 wherein the secondary buffer driver stage is configured to maintain the previous value generated by the primary driver stage, whilst the primary driver stage is switched off.

8. The integrated circuit of claim 1 wherein the secondary buffer driver stage is a size factor smaller than the primary buffer driver stage.

9. The integrated circuit of claim 1 wherein a latch element is operably coupled to the secondary buffer driver stage and arranged to receive the at least one input signal and provide a latched input signal to the secondary buffer driver stage.

10. The integrated circuit of claim 1 wherein the secondary buffer driver stage is switched off when in a steady state condition whilst the primary driver is switched on.

11. The integrated circuit of claim 1 wherein the secondary buffer driver stage is part of and cooperates with the primary driver stage.

12. The integrated circuit of claim 1 wherein the secondary buffer driver stage is switched off when in a steady state condition whilst the primary driver is switched on and the processor module is configured to apply an automatic switching of the IO buffer driver circuit output from the primary buffer driver stage to the secondary buffer driver stage operation.

13. The integrated circuit of claim 1 wherein the processor module is configured to adapt a toggling frequency of switching of the IO buffer driver circuit output from the primary buffer driver stage to the secondary buffer driver stage operation, dependent upon an IO buffer driver application and/or at least one prevailing operating condition.

14. A method for bias stress condition removal in a circuit comprising at least one input/output (IO) buffer driver circuit, the method comprising:
   receiving at least one input signal at a primary buffer driver stage and providing an output signal in a first time period;
   receiving the at least one input signal at a secondary buffer driver stage and providing an output signal in a second time period, wherein the primary buffer driver stage and the secondary buffer driver stage cooperate;
   varying an operational mode of the primary buffer driver stage and varying an operational mode of the secondary buffer driver stage to produce a variable output signal; and
   adapting a toggling frequency of switching of the IO buffer driver circuit output from the primary buffer driver stage to the secondary buffer driver stage operation, dependent upon an IO buffer driver application and/or at least one prevailing operating condition.

* * * * *